United States Patent [19]

Suemasa et al.

[11] 4,002,929
[45] Jan. 11, 1977

[54] A.C. TYPE TIMER CIRCUIT

[75] Inventors: Hideo Suemasa, Hirakata; Kazuyoshi Honda, Kadoma; Katsuhiko Fukutake, Matsusaka; Kenichi Yoda, Moriguchi, all of Japan

[73] Assignee: Matsushita Electric Works, Ltd., Osaka, Japan

[22] Filed: June 23, 1975

[21] Appl. No.: 589,704

[30] Foreign Application Priority Data

June 28, 1974 Japan .............................. 49-74573

[52] U.S. Cl. ....................... 307/252 W; 307/252 J; 307/293; 323/225 C
[51] Int. Cl.² ....................................... H03K 17/72
[58] Field of Search ....... 307/252 F, 252 J, 252 W, 307/293; 323/225 C

[56] References Cited
UNITED STATES PATENTS 3,286,621    11/1966    Martin, Jr. ..................... 307/252 J
3,694,669    9/1972    Witt et al. ..................... 307/252 F

*Primary Examiner*—John Zazworsky
*Attorney, Agent, or Firm*—Pierce, Scheffler & Parker

[57] ABSTRACT

Contactless two-line type timer circuit operable stably for a load of even a small current. In the circuit comprising substantially a full-wave rectifying circuit connected through the load to AC source, a thyristor connected across output terminals of the rectifying circuit and means for applying pulses to the gate of the thyristor after a predetermined time period, a first resistance is inserted between the cathode of the thyristor and negative side output terminal of the rectifying circuit and a second resistance is inserted between the gate of the thyristor and said negative side output terminal so as to allow the thyristor to be of a lower gate sensitivity and to be capable of keeping the gate voltage of the thyristor always larger than the cathode voltage.

3 Claims, 5 Drawing Figures

A.C. TYPE TIMER CIRCUIT

This invention relates to alternating current type timer circuits and, more particularly, to a two-line type timer circuit.

Conventional alternating current type timer circuits of this kind have been formed in such manner that, usually, an alternating current voltage would be rectified first to obtain a direct current voltage and then this rectified direct current voltage would be added to a direct current relay to operate said direct current relay after a fixed time. In such case, as a smoothing condenser is used in a part of the rectifying circuit to rectify the alternating current, there has been a defect that the reliability of the timer or particularly the reliability in its use at a high temperature or when in continuous use will be reduced. Further, as a direct current relay is used, a connecting line is likely to be damaged or broken by electrolytic corrosion. For an alternating current of a 200 volt class, there is available high voltage direct current relay of a low cost and, therefore, a voltage reducing resistance is connected in series with a relay coil. In this case, too, there have been such defects that, due to heat generation at such resistance, other electronic parts will deteriorate in the characteristics and will become short in service life. Further, in the case of using a mechanical contact for self-holding with a view to maintaining the operating state of the relay after a given time is out, such trouble as, for example, a faulty contact will be likely to be caused to occur by the contact. Further, as a contact which is to be inherently used to drive a load is used for the self-holding of the relay, there has been a defect that the number of output contacts will have to be decreased.

In order to remove such defects as described above, there has been suggested a so-called alternating current contactless two-line type timer using neither smoothing condenser nor mechanical contact. A circuit as shown in FIG. 1 which shall be explained in the following is a typical example thereof.

The known timer circuit of FIG. 1 has been suggested in U.S. Pat. No. 3,633,047 to Kadah et al. In the drawing, an alternating current relay or load is denoted by X and a full-wave rectifying circuit is denoted by $D_B$. An alternating current is given from a source to the full-wave rectifying circuit $D_B$ through the alternating current relay X. A rectified output is given respectively to a series circuit of a resistance $R_o$ and condenser $C_o$ and, through a thyristor S and resistance $R_4$, to a series circuit of a variable resistance $R_T$ and condenser $C_T$ and also a series circuit of resistances $R_2$ and $R_3$. The gate G of a voltage comparing element P, that is, a programmable unijunction transistor in the present instance (which shall be referred to as PUT hereinafter) is connected to the junction of the resistances $R_2$ and $R_3$, the anode A of the PUT is connected to the junction of the variable resistance $R_T$ and condenser $C_T$, the cathode is connected to the gate of the thyristor S and resistance $R_g$, and the condenser $C_1$ is connected in parallel with the resistance $R_g$. In this circuit, when an alternating current is applied from the source between terminals $a$ and $b$, a full-wave rectifying voltage will appear between terminals $d_1$ and $d_2$, thereby the condenser $C_T$ will be charged and the terminal voltage of the condenser $C_T$ will gradually rise. When the potential of the anode A of the PUT becomes higher than the potential of the gate G, the PUT will be ON, and the thyristor S will be also ON so that the current will flow through the relay X to operate it.

When the current in the relay X or load used in this circuit is small, the self-holding of the thyristor S will be difficult to be achieved. That is, as the full-wave rectifying voltage becomes zero every half cycle, in practice, in case the load current is less than 20m.A., the thyristor will be difficult to achieve its self-hold even if the gate voltage is in charging condition due to the discharge of the charge in the condenser $C_1$. Therefore, the thyristor must be high in the gate sensitivity and low in the holding current. Further there is a defect that the current range controllable by the thyristor varies so widely with variations of peripheral temperature that the thyristor will erroneously turn off. Further, while a smoothing condenser $C_o$ is required, this condenser must be high in withstanding performance to voltages, so that there will be also such defects that is dimensions have to become large, and that, when the timer is connected with the current source, the relay X will temporarily mal-function due to the current dashing into the condenser $C_o$.

The present invention has been suggested to solve the above mentioned defects and, according to the present invention, problems involved in solving such defects have been successfully removed by inserting a resistance as connected to the cathode of the thyristor S and inserting a resistance in series with the condenser connected with the gate of the thyristor.

A primary object of the present invention is, therefore, to provide a contactless two-line type timer which can be used for such small current flowing through a relay coil or load as, for example, an alternating current of 1 to 5 m.A.

Another object of the present invention is to provide a timer which will accurately operate at a desired time without causing a given limit time of the timer to be varied even in the case where a voltage applied to the timer is removed before the timer operates and a voltage is again applied to the timer.

A further object of the present invention is to provide a timer wherein no direct current relay coil is used and it is not necessary to use any voltage reducing resistance, so that other electronic parts will be not likely to be deteriorated by any heat generation of said resistance and thus the life of the timer will be prolonged.

The present invention shall now be explained in detail with reference to certain preferred embodiments as shown in accompanying drawings, in which.

Figure 2:
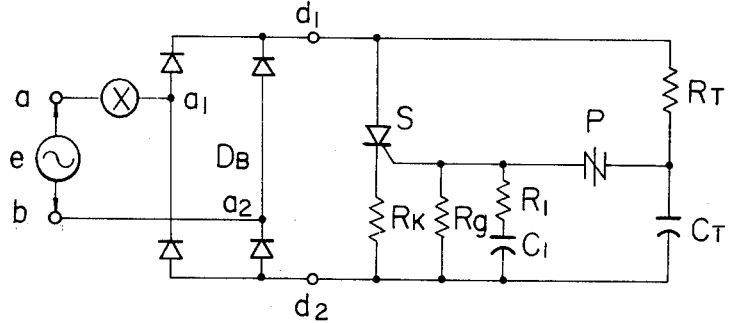
FIG. 2 is an embodiment of the timer circuit of the present invention.

Referring now to FIG. 2 showing an embodiment of the present invention, such a load as a relay in the present instance for the timer circuit is denoted by X. The relay X is inserted between a pair of terminals $a$ and $b$ of an alternating current source $e$ and a full-wave rectifying circuit $D_B$. References $d_1$ and $d_2$ denote respectively terminals at which a rectified direct current voltage is obtained. A thyristor S is connected between the terminals $d_1$ and $d_2$ in series with a cathode resistance $R_K$ (first resistance). Further, a series circuit of a resistance $R_T$ and a condenser $C_T$ forming a time-limiting RC network is also inserted between the terminals $d_1$ and $d_2$. A voltage detecting element P comprising, for example, an SSS, i.e. a silicon symmetrical switch or SBS, i.e. a silicon bilateral switch is inserted between the junction of the resistance $R_T$ and condenser $C_T$ and the gate of the thyristor S. A series circuit of a resistance $R_1$ (second resistance) and condenser $C_1$ (first condenser) is inserted between the gate of the thyristor S and the terminal $d_2$ (on the minus side), and a resistance $R_g$ (third resistance) is connected in parallel with this series circuit.

The operation of this circuit shall be explained in the following. When a current is applied from the source e across the terminals a and b, a full-wave rectified voltage will be impressed on the circuit through coils of the relay X and full-wave rectifying circuit $D_B$ and the condensor $C_T$ in the RC network will be charged through the resistance $R_T$ in the same network. When the terminal voltage of the condenser $C_T$ reaches the detected voltage of the voltage detecting element P after a fixed time, the voltage detecting element P will conduct and will give a gate current to the thyristor S to render it conductive and the relay X will operate through the full-wave rectifying circuit $D_B$, thyristor S and cathode resistance $R_K$. The feature of this circuit resides in the use of the resistances $R_K$ and $R_1$. The reasons shall be detailed in the following.

The advantage of using the resistance $R_K$ is as follows:

When the potential of the cathode of the thyristor S is slightly elevated with the resistance $R_K$, the condenser $C_1$ connected with the gate of the thyristor will be able to be charged to a voltage much higher than the voltage drop in the normal direction between the gate and cathode of the thyristor through the anode gate of the thyristor and, therefore, the discharge time constant of the condensor $C_1$ will be able to be made large and even a thyristor low in the gate sensitivity will be able to be used. Further, as will be described later, even in case the coil current of the relay X is small, such a thyristor will be able to be used.

Figure 3:
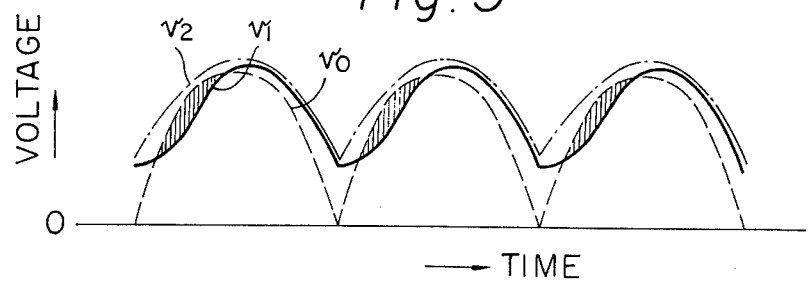
FIG. 3 is a diagram for explaining the operation of the circuit in FIG. 2.

The advantage of using the resistance $R_1$ is as follows:

Here, a case where the resistance $R_1$ is not used shall be considered. As long as the coil current of the relay X is small, as shown in FIG. 3, there will be produced a region which is the hatched part in the drawing and is produced due to a phase delay caused by the condenser $C_1$, in which the gate voltage $v_1$ (when $R_1 = 0$) of the thyristor S is lower than the cathode voltage $v_0$. In this state, when the instantaneous value of the current passed through the thyristor S becomes lower than the holding current of the thyristor S, the thyristor S will turn off and the relay X will return to its original state so as to produce a mal-function.

On the other hand, when the resistance $R_1$ is inserted ($R_1 \neq 0$), any region in which the gate voltage $v_2$ of the thyristor S is lower than the cathode voltage $v_0$ will not be produced as the resistance $R_1$ prevents the phase delay, thus, always $v_0 < v_2$ and the thyristor S will not turn off while the source current is being impressed to the circuit.

Therefore, even in case the coil current of the relay X is small, a thyristor S of a low gate sensitivity and high holding current will be able to be used.

Figure 1:
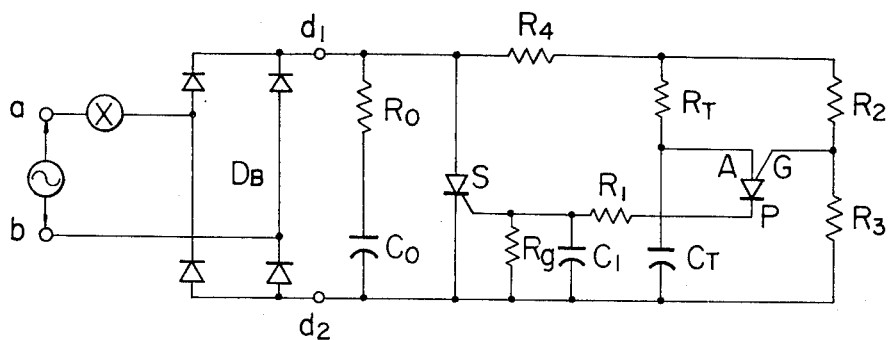
FIG. 1 is a conventional timer circuit diagram.

Experimental values shall be enumerated in the following:

|  | In the case of FIG. 1: (Prior Art) | In the case of FIG. 2: (Present invention) |
| --- | --- | --- |
| Circuit constants: | $R_u$ (KΩ) 4.7 | 4.7 |
|  | $C_1$ (μF) 10 | 10 |
|  | $C_u$ (μF) 0.2 | — |
|  | $R_u$ (Ω) 100 | — |
|  | $R_1$ (KΩ) — | 1 |
|  | $R_K$ (Ω) — | 220 |
| Minimum current the thyristor can conduct and hold: | 20m.A.(A.C.) | 1m.A.(A.C.) |

It is considered thereby that, according to the present invention, even if the load current is small, the thyristor will not be caused to turn off.

Figures 4, 5:
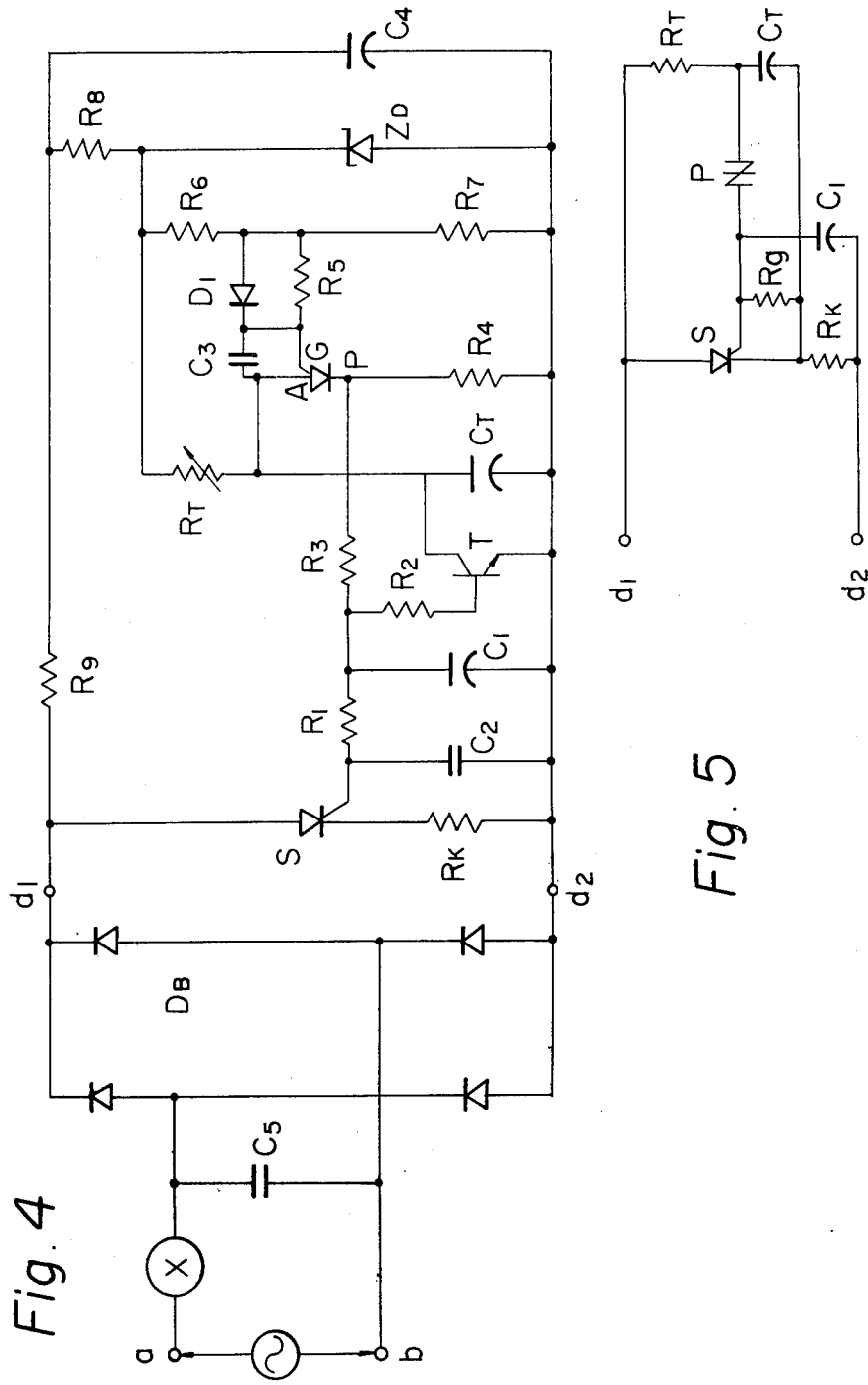
FIG. 4 is a practical circuit diagram of the embodiment shown in FIG. 2.
FIG. 5 shows another embodiment of the timer circuit of the present invention.

Referring next to FIG. 4 showing a practical circuit diagram of the embodiment as in FIG. 2 according to the present invention, rectified output terminals $d_1$ and $d_2$ are formed through a relay X and full-wave rectifying circuit $D_B$ from alternating current source terminals a and b, a series circuit of a thyristor S and resistance $R_K$ (first resistance) is connected with said rectifying output terminals $d_1$ and $d_2$, a series circuit (constant voltage circuit) of a resistance $R_8$ and Zener diode ZD is connected with the rectified output terminals $d_1$ and $d_2$ through a resistance $R_9$, and a condenser $C_4$ is connected in parallel with this series circuit. Further, a series circuit of a variable resistance $R_T$ and a condenser $C_T$ forming a time-limiting RC network is connected in parallel with the Zener diode ZD. Said condenser $C_T$ in the RC network is connected at one end with the anode A of a voltage detecting element P comprising a PUT and at the other end with a resistance $R_4$ (fourth resistance) connected in series with the cathode. The gate G is connected with the junction of resistances $R_6$ (sixth resistance) and $R_7$ (seventh resistance) through a resistance $R_5$ (eighth resistance). A diode $D_1$ is connected in parallel with the resistance $R_5$. A condenser $C_3$ for absorbing foreign surges is inserted between the anode A of the PUT and the gate G. Further, a series circuit of resistances $R_1$ (second resistance) amd $R_3$ (fifth resistance) is connected between the gate of the thyristor S and the cathode of the PUT. A condenser $C_2$ for absorbing foreign surges is connected between the gate of the thyristor S and the negative side terminal $d_2$ for the rectified output. A variable condenser $C_1$ (first condenser) is connected between the junction of the resistances $R_1$ and $R_3$ and the terminal $d_2$. The base of a transistor T is connected with said junction through the resistance $R_2$ (third resistance). The collector and emitter of said transistor T are connected with both ends of the condenser $C_T$.

The operation of this circuit shall be explained in the following. When an alternating current from the source is applied between the terminals a and b, a rectified output will appear at the terminals $d_1$ and $d_2$ through the relay X and full-wave rectifying circuit $D_B$, a fixed direct current voltage will be given to the condenser $C_T$ through the resistance $R_T$ by the condenser $C_4$ and constant voltage circuit of $R_8$ and ZD so that the condenser $C_T$ will be charged, the voltage across this condenser will rise and this potential will be given to the anode A of the PUT. When this potential rises to be higher than the potential of the gate G, the PUT will conduct, the cathode potential of the PUT will be given to the gate of the thyristor S through the resistances $R_1$ and $R_3$, the thyristor S will conduct, the current will flow through the relay X and the relay will operate.

The circuit as shown in FIG. 4 is improved in such manner that the residual charge of the condenser $C_T$ in the RC network can be perfectly discharged and a stabilized delay time can be repeatedly obtained. When the PUT is triggered, the charge of the condenser $C_T$ will be discharged through the PUT and resistance $R_4$. At this time, due to the voltage drop between the anode and cathode of the PUT, in fact, a charge of about 0.7V will remain in the condenser $C_T$. This charge is to be discharged through the transistor T and, when the PUT is triggered, the condenser $C_1$ will be charged with the discharge of the condenser $C_T$ through the PUT and resistance $R_3$, so that the transistor T will be conducted with the energy of the charge of the condenser $C_1$ and the residual charge of the condenser $C_T$ will be perfectly discharged. Therefore, in the timer according to the present invention, even if the charge is removed in the course of the RC network, the condenser $C_T$ in the RC network will be perfectly discharged and a fixed stabilized time will be able to be obtained for the next delay time.

In FIG. 5 showing another embodiment of the present invention, its arrangement is different from the embodiment in FIG. 2 in respect that a resistance $R_g$ connected in parallel with the condenser $C_T$ in the RC network is inserted between the gate and cathode of the thyristor S and that the condenser $C_1$ is inserted between the gate of the thyristor S and the rectified output terminal $d_2$.

In the circuit of FIG. 2, when the thyristor S conducts, a voltage drop in the resistance $R_K$ will result in that a slight charge may remain in the condenser $C_T$ in the RC network and may cause the repeated precision of the timer to reduce. In the embodiment of FIG. 5, on the other hand, the block of the RC delay circuit is perfectly short-circuited between the anode and cathode of the thyristor and, therefore, the repeated precision can be improved to be higher than that in the case of the embodiment of FIG. 2.

In order to attain the same effect as above in the cases of FIGS. 2 and 4, it will be possible to connect a diode in parallel with the resistance $R_K$ so as to limit the voltage across this resistance.

While in the above descriptions the load has explained mostly as a relay it will be obvious that any other sort of load can be used with the time circuit of the present invention.

What is claimed is:

1. An alternating current type timer circuit comprising a load inserted between an alternating current source and a full-wave rectifying circuit, a first series circuit of a thyristor and a first resistance inserted between output terminals of said full-wave rectifying circuit, said first resistance being connected between the cathode of said thyristor and the negative side of said output terminals of the full-wave rectifying circuit, a time-limiting circuit of a series connected time-limiting resistance and time-limiting condenser connected with the output terminals of the full-wave rectifying circuit, a pulse applying means connected with the gate of the thyristor and said time-limiting circuit, said pulse applying means being caused by the time-limiting circuit to generate pulses at a desired time after an alternating current is applied from said source, a second series circuit of a second resistance and a first condenser inserted between the gate of the thyristor and the negative side of the output terminals of the full-wave rectifying circuit, and a transistor connected at its base with the junction of said second resistance and first condenser through a third resistance and at the emitter with the junction of the first condenser and the negative side of the output terminals of the full-wave rectifying circuit, said time-limiting condenser being inserted between the collector and emitter of said transistor.

2. A timer circuit according to claim 1 wherein said pulse applying means comprises a series circuit of a current-limiting resistance and a smoothing condenser connected between said output terminals of the full-wave rectifying circuit, a constant voltage circuit connected with both ends of said smoothing condenser, a series network of a resistance and condenser for a time-limiting connected with both ends of said constant voltage circuit, and a voltage comparing element connected in parallel with said condenser in the time-limiting network, said element being ignited by a rise of a voltage across the condenser in the time-limiting network to provide a potential to the gate of the thyristor.

3. A timer circuit according to claim 2 wherein said pulse applying means further comprises a third series circuit of two resistances connected with both ends of said constant voltage circuit, and said voltage comparing element is a programmable unijunction transistor connected at the anode and cathode in parallel with said condenser in the time-limiting network and at the gate with the junction of said resistances in said third series circuit through a parallel circuit of a diode and a resistance.

* * * * *